United States Patent
Bakker et al.

(10) Patent No.: US 6,459,521 B1
(45) Date of Patent: Oct. 1, 2002

(54) ELECTROABSORPTION MODULATOR INTEGRATED DISTRIBUTED FEEDBACK LASER TRANSMITTER

(75) Inventors: Laurens Bakker, Enschede (NL); Naresh Chand, Berkeley Heights; Doutje Tjitske van Veen, Basking Ridge, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/828,094

(22) Filed: Apr. 6, 2001

Related U.S. Application Data
(60) Provisional application No. 60/228,387, filed on Aug. 28, 2000.

(51) Int. Cl.[7] .............................. G02F 1/01; H04B 10/04
(52) U.S. Cl. ...................... 359/239; 359/238; 359/180; 359/181
(58) Field of Search ................................ 359/239, 238, 359/244, 180, 181, 158, 140

(56) References Cited

U.S. PATENT DOCUMENTS
5,678,198 A * 10/1997 Lemson ...................... 455/67.1
5,754,577 A * 5/1998 Casper et al. .................. 372/38

* cited by examiner

Primary Examiner—Georgia Epps
Assistant Examiner—Timothy Thompson
(74) Attorney, Agent, or Firm—Lowenstein Sandler PC

(57) ABSTRACT

An optical transmitter for digitally modulated RF sub-carriers comprising an electroabsorption modulator integrated distributed feedback laser for transmitting the digitally modulated RF sub-carriers in the sub-octave frequency range. The negative bias is optimized for maximum carrier signal to noise ratio (CNR) which occurs when the composite triple beat (CTB) non-linear distortion is minimum that allows higher modulation index without causing any in-band distortion. A higher CNR increases the receiver sensitivity and thus more users can be served from a single transmitter or the transmitting signal can be modulated with higher order of digital modulation.

12 Claims, 9 Drawing Sheets

ELECTROABSORPTION MODULATOR INTEGRATED DISTRIBUTED FEEDBACK LASER TRANSMITTER

CROSS REFERENCES TO RELATED APPLICATIONS

This application claims the benefit of U.S. Provisional application Ser. No. 60/228,387, filed on Aug. 28, 2000.

FIELD OF THE INVENTION

This invention relates to optical communication systems and, in particular, to a transmitter for digitally modulated RF sub-carriers.

BACKGROUND OF THE INVENTION

An ever increasing communication need of today is to deliver multimedia services such as voice, data, high speed internet access, video conferencing, video on demand, and broadcast television video to small businesses and residences. Cost is the prominent issue for the deployment of such networks. Optical fiber extending closer to users—Fiber to the curb (FTTC) and hybrid fiber coaxial (HFC), or fiber all the way to the user—Fiber to the Home (FTTH)—are the technologies currently being deployed to meet present and future needs. Both the existing operators and overbuilders are taking fiber as deep into their networks and closer to the customers as their costs allow.

Two different optical fiber communication systems have evolved for carrying information to homes and businesses. Each system has its own specialized equipment, its own physical plant and its own standards. One system delivers information by a digitally modulated series of light pulses. These are referred to as baseband signals. FIG. 1 illustrates a simplified baseband modulation scheme. Typically a digital 1 is represented by a light pulse in the series and a digital 0, by the absence of a pulse in a pulse position. Alternatively, the signal can be inverted with a pulse representing digital 0 and its absence representing 1.

A second system uses a plurality of radio frequency separated carriers. Each carrier is modulated to transmit a higher order digital signal. These are passband signals. FIG. 2a schematically illustrates a passband lightwave transmission system 20 comprising a hub 21, and a plurality of fibers 22A, 22B, 22C connecting the hub to a respective plurality of fiber nodes 23A, 23B and 23C. Each node is connected, as by a plurality of fibers or coaxial cables 24A and 24B to a plurality of homes 12 and businesses 13.

FIG. 2b illustrates the radio frequency spectrum of a typical digitally modulated passband signal. The signal comprises a plurality of different radio frequency (RF) carriers spaced apart in frequency (e.g. 6 MHz spacing in the NTSC system). Each of the carriers is modulated among a plurality of states to carry a higher order digital signal to encode plural bits for each modulation state. The modulation can be amplitude modulation, frequency modulation, phase modulation or a combination of them.

Digital passband signals are conventionally transmitted using two RF carriers that are frequency locked but 90 degrees out of phase. The two carriers are said to be in quadrature. The two carriers are separately amplitude modulated (AM), and the modulated carriers are combined to form a single RF output having both amplitude information corresponding to their vector sum and phase information corresponding to their vector angle. The technique is known as quadrature amplitude modulation or QAM.

FIG. 2c illustrates the simplest case of QAM, which occurs when each of the carriers has only two states (e.g. +V and -V). One carrier is considered the reference carrier and is called the in-phase channel. It's amplitude is represented along the horizontal axis of FIG. 2c. The other carrier, 90° out of phase, is called the quadrature channel. Its amplitude is represented along the vertical axis. As can be seen from the diagram, if each carrier has two states (±V, ±V), then there are four possible combined outputs, each of which can represent two bits of information: (0,0), (0,1), (1,0), (1,1). This simple modulation scheme is known as quadrature phase shift keying (QPSK).

Similar modulation schemes can be based on amplitude modulation of the carriers among a larger number of states. For example if both carriers can be modulated among four amplitudes, the combined output can represent 4×4=16 states, and the modulation is called 16-QAM. Modulation using 8×8=64 states is 64-QAM. In an optical communication system, optical transmission of sub-carrier multiplexed (SCM) multi-channel M-ary quadrature amplitude modulation (QAM) signals has many advantages over the analog amplitude modulated vestigial side band (AM-VSB) signals. Some of the advantages include: requirements of lower carrier signal-to-noise ratio (CNR); less sensitivity to non-linear distortion; high spectral efficiency; high system transmission capacity; and, the ability to transmit all multimedia services (telephony, digital video and data). Cable companies are upgrading their Hybrid Fiber Coax (HFC) networks to create a fully interactive two-way network to carry high bandwidth multimedia services into and out of homes. Because of these advantages coupled with higher revenue generating opportunities for service providers, arrival of High Definition Television (HDTV), availability of digital televisions and set top conversion boxes, transmission of video signals in near future is likely to be all-digital.

While data can advantageously be transmitted using a baseband technique, for video transmission a passband technique is preferred by both telecom and cable TV industry as well as by overbuilders because of technical, economic and management reasons. For these reasons the full service access network (FSAN) group of global telecommunication operators has recently drafted new standards, called G983.wdm, for ITU-T for adding digital video in passband to ATMPON baseband services utilizing frequency division multiplexing (FDM) and wavelength division multiplexing (WDM) techniques which is shown in FIG. 3. Referring to FIG. 3 there is shown the architecture of an exemplary WDM network to deliver digital video in passband over a separate wavelength along with baseband data using wavelength division multiplexing (WDM). Digital video can be delivered by utilizing QPSK in 950–2050 MHz band or 64-QAM in MMDS 216–422 MHz band or CATV 550–800 MHz band. Located at the central office 302 is a data optical line terminator 304, a video optical line terminator 306 and a wavelength division multiplexer 308. The data optical line terminator 304 and the video optical line terminator 306 are coupled to the wavelength division multiplexer 308. The wavelength division multiplexer 308 is coupled to an optical fiber transmission link 310. The optical fiber transmission link 310 is coupled to a 1:n splitter 312, which splits the optical signal for delivery to a home 314. Located at the home 314 is a wavelength division demultiplexer 316, a data optical network terminator 318, and a video optical network terminator 320. The data optical network terminator 318 and the video optical network terminator 320 are coupled to the wavelength division demultiplexer 316. The wavelength division demultiplexer 316 is coupled to the 1:n splitter 312.

One of the more expensive network elements in the video lightwave transmission system is the video laser transmitter. For a low cost per user, a video transmitter needs to be shared by as many users as possible. If by suitably designing a laser transmitter, the optical/electrical (O/E) receiver sensitivity can be increased by ~4 dBo, two and half times more users can share the same transmitter. Note that dBo represents optical dB, dBe represents electrical dB, and dBm represents power with reference to 1.0 mW. Thus dBmo and dBme will represent optical and electrical dB with reference to 1.0 mW optical and electrical power, respectively.

Presently CATV and MMDS utilize a 64-QAM format for downstream services. QPSK (4QAM) or 16 QAM formats are used for upstream services typically utilizing a 1.3 µm Febry-Perot laser. When the value of M in M-ary increases by one, for a given bit error rate the required carrier signal to noise ratio (CNR) for a sub-carrier at the receiver increases by 3-dBe which is equivalent to 1.5 dBo decrease in receiver sensitivity. A 4 dBo increase in receiver sensitivity will allow 16-QAM and 64-QAM schemes to be upgraded to 64-QAM for upstream and 256 QAM for downstream, respectively within the same power budget. This upgrade results in a higher transmission capacity.

SUMMARY OF THE INVENTION

In one aspect, the present invention features a transmitter for digitally modulated RF sub-carriers comprising an electroabsorption modulator integrated distributed feedback laser (EML) having an electroabsorption modulator section for transmitting the digitally modulated RF sub-carriers in the sub-octave frequency range. Wherein the negative bias is selected to increase modulation index of the electroabsorption modulator section of the electroabsorption modulator integrated distributed feedback laser above a modulation index of an electroabsorption modulator section of an electroabsorption modulator integrated distributed feedback laser having a zero bias, without causing in-band non-linear distortion.

BRIEF DESCRIPTION OF THE DRAWINGS

The advantages, nature and various additional features of the invention will appear more fully upon consideration of the illustrative embodiments described in connection with the accompanying drawings. In the drawings.

DETAILED DESCRIPTION OF AN EXEMPLARY EMBODIMENT

In an Optical system, in the absence of composite second order (CSO), composite triple beat (CTB), clipping and other non-linear distortions, the CNR of a sub-carrier that determines the bit error rate is related to the laser modulation index, m, and the mean square photocurrent ($I_{ph}$). This relationship is shown in equation 1 below.

$$CNR \approx \frac{(mI_{ph})^2}{2B_{eff}(n_{ph}^2 + 2qI_{ph} + I_{ph}^2 RIN)} \qquad \text{Eq. 1}$$

Wherein, $B_{eff}$ is the effective carrier bandwidth, $n_{th}$ is the receiver thermal noise current presented to the preamplifier (typically 5 to 10 pA/Hz), RIN is the transmitter relative intensity noise in dB/Hz and q is the electron charge. The first term in the denominator is the thermal noise and the second term is the shot noise of the receiver. For modern distributed feedback (DFB) lasers, the RIN of the transmitter is insignificant compared to the thermal noise and shot noise. $I_{ph}$ is proportional to the received optical power ($P_{op}$) at the receiver. For a given carrier bandwidth and the received optical power that determines $I_{ph}$, the only parameter that can be used to increase CNR significantly is m. Increasing of m beyond a particular point results in nonlinear distortion such as CSO, CTB and clipping. However, by suppressing CSO and CTB, m can be increased to increase the CNR.

The electroabsorption (EA) effect is an effect in which the absorption of input light depends on an applied voltage (bias). When the absorption amount changes, the refractive index is inevitably changed. It is found that for transporting QAM RF sub carrier in the sub-octave frequency range, electroabsorption modulator integrated distributed feedback lasers (EMLs) can be modulated with a significantly higher (2.5 times) modulation index without causing any in-band signal distortion as compared to directly modulated distributed feedback (DFB) lasers and commercially available externally modulated 1.55 µm transmitters. Compared to an externally modulated transmitter using a LiNbO₃ (lithium niobate) MachZehnder modulator, an EML transmitter provides DC drift free operation, lower power consumption, ease of use, significantly lower cost and smaller size.

The invention may now be better understood by consideration of the following specific examples and tests. In the examples and tests, which are intended for those skilled in the art, the acronyms used are expanded when they are first used and in the definitions section at the end of this application. The following examples are provided for the purpose of illustration only. The examples should not be construed as limiting the inventions claimed.

EXAMPLE

This example demonstrates one embodiment. The experimental detail combined with the description above shows advantages of various possible components and methods.

Figure 1:
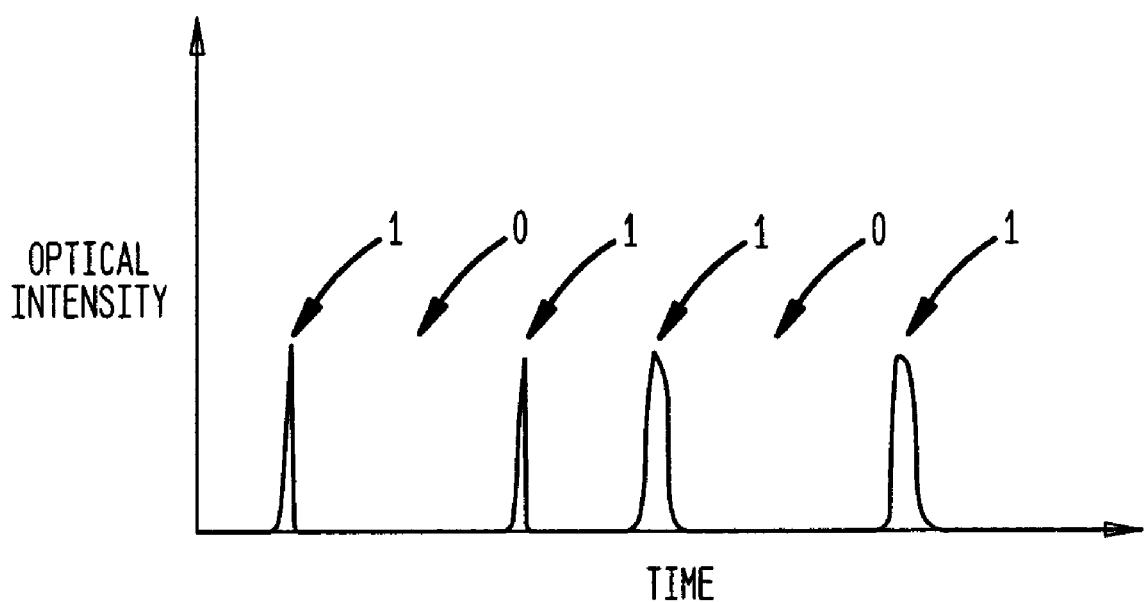
FIGS. 1 illustrates baseband signal consisting of '1' and '0'.
Figure 2A:
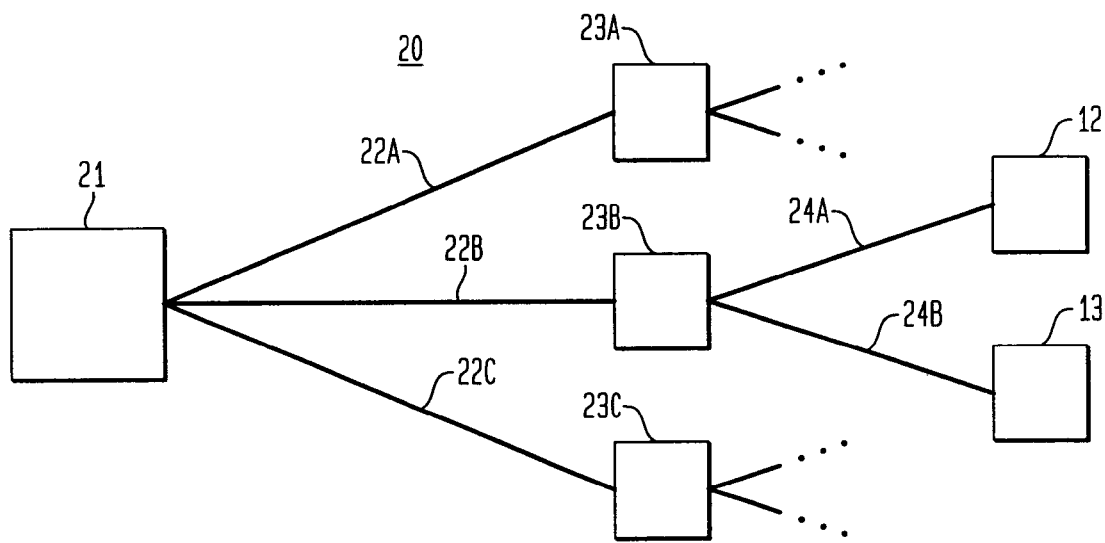
FIGS. 2a, 2b and 2c illustrate features of a passband communication system.
Figure 2B:
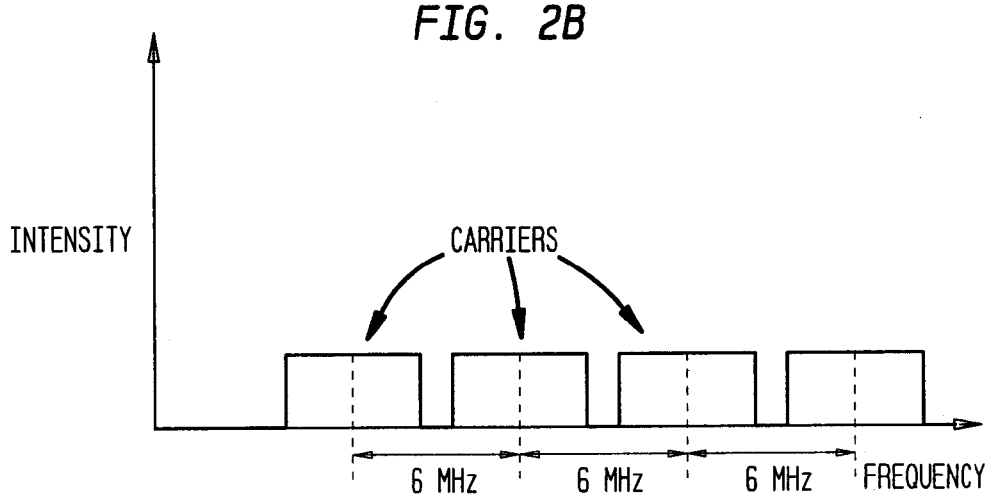
Figure 2C:
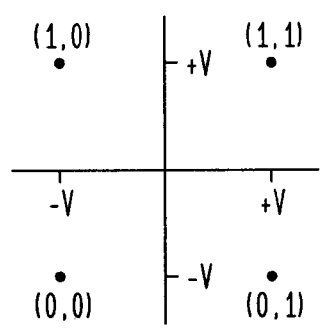
Figure 3:
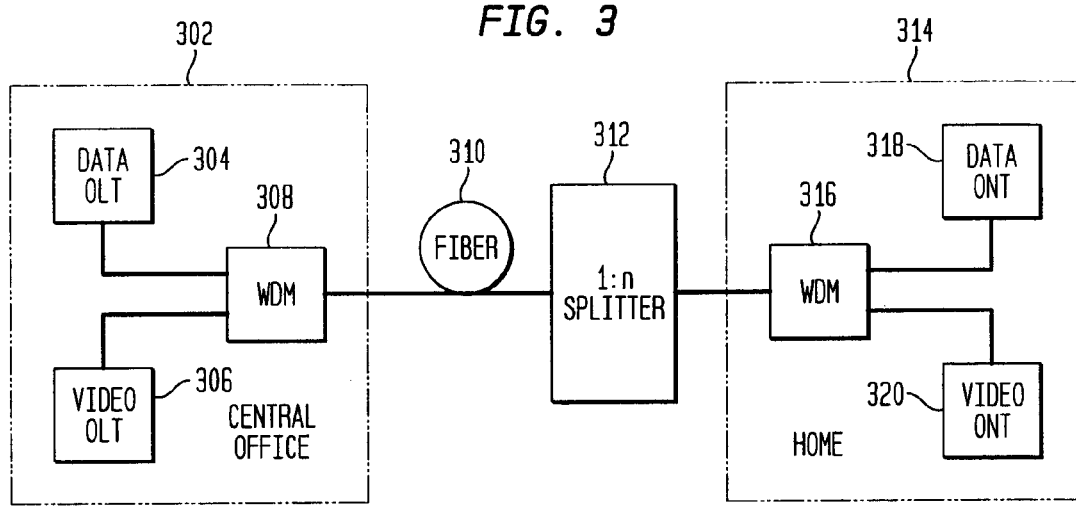
FIG. 3 is a schematic block diagram of a WDM optical communication system for delivering baseband services and digital video in passband.
Figure 4:
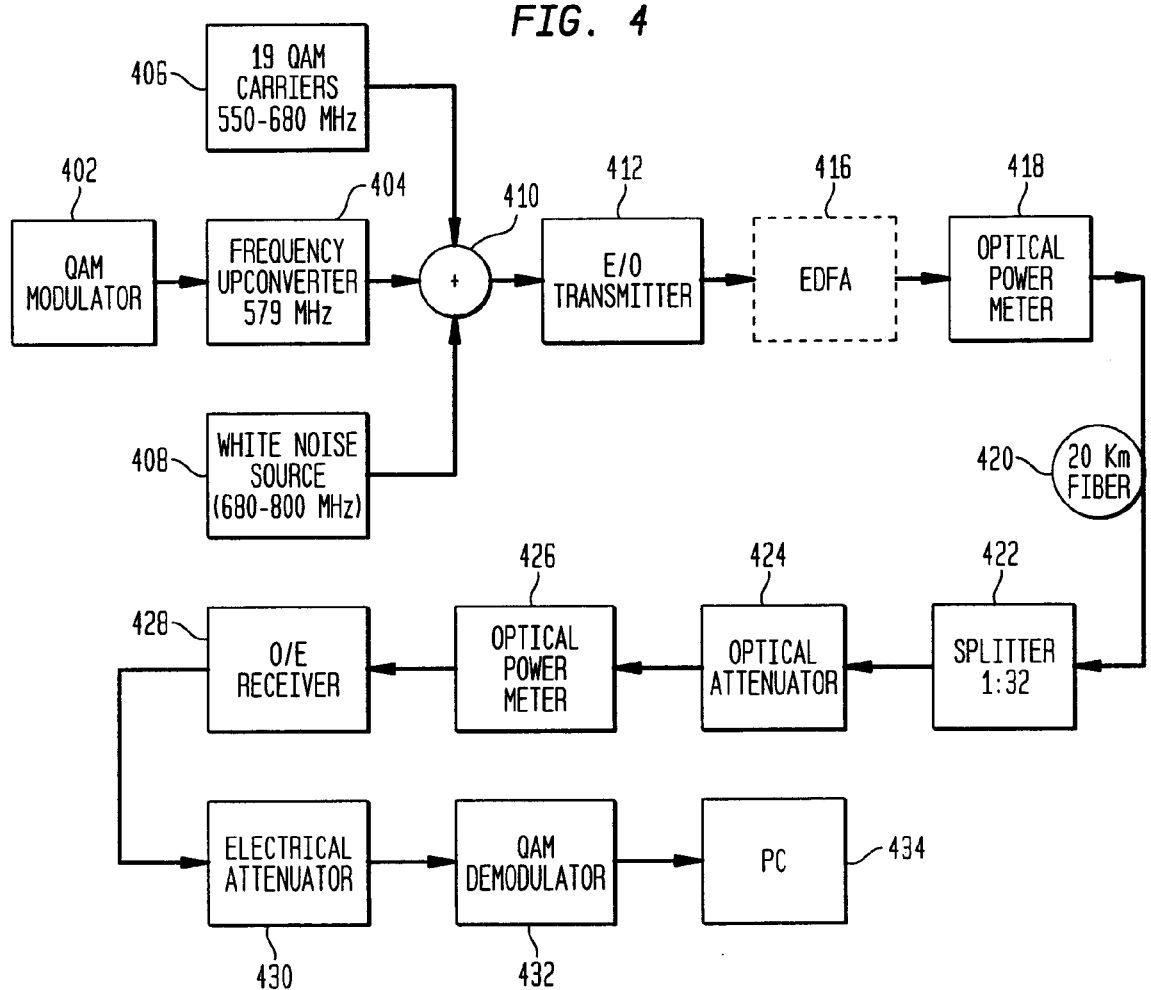
FIG. 4 is a schematic representation of a test set up used for studying the various laser transmitters for QAM sub-carrier multiplexed signal transmission.

Referring to FIG. 4, there is shown a schematic representation of an exemplary experimental set up used to study the comparative performance of various transmitters. A QAM modulator 402 is coupled to a frequency upconverter 404. Nineteen QAM carriers 550–680 MHz 406, a 680–800 MHz white noise source 408, and a frequency up converter 404 are coupled to adder 410. An electroabsorption modulator integrated distributed feedback laser (EML) transmitter 412 (electrical/optical (E/O) transmitter) is coupled to the output of the adder 410. The output of the EML transmitter 412 is coupled to an erbium-doped fiber amplifier 416. The output of the erbium-doped fiber amplifier 416 is coupled to an optical power meter 418. A 20 km optical fiber 420 is coupled between the optical power meter 418 and a 1:32 splitter 422. An optical attenuator 424 is coupled to an output of the 1:32 splitter 422. The output of the optical attenuator 424 is coupled to an optical power meter 426. An optical/electrical (O/E) receiver 428 is coupled to the output of the optical power meter 426. An electrical attenuator 430 is coupled to the output of the O/E receiver 428. A QAM demodulator 432 is coupled to the output of the electrical attenuator 430. The output of the QAM demodulator 432 is coupled to a personal computer (PC) 434.

This example uses an RF signal comprising 20 sub-carriers of 6-MHz bandwidth each modulated in 64-QAM or 256-QAM format and a white noise source to simulate 20 sub-carriers in 680–800 MHz range. By turning off one of the QAM carriers, a 64-QAM or 256-QAM test sub-carrier of the same 6-MHz bandwidth can be inserted with a 5.063 Mbps symbol rate from a Broadcom modulator. In this example, the test carrier was inserted at 579 MHz. DAVIC forward error correction (FEC) scheme is utilized as offered in the Broadcom modulator and demodulator. All three signals are adjusted to the same level as shown in the RF spectra of the combined signal in FIG. 5a. The combined RF signal after suitable electrical amplification was used to modulate the laser transmitters. For comparing performance, several transmitters were used including three EML based transmitters (two in L-band and one in C-band), six directly modulated DFB laser transmitters (four in C-band and two in L-band) and two commercially available externally modulated transmitters (C-band) that use a lithium niobate modulator. C and L bands typically represent optical wavelengths in 1480–1560 nm and 1560–1600 nm range, respectively.

The optical signal from the transmitter is coupled into the 20-km long standard fiber that has a 1:32 optical power splitter, optical attenuator and several in-line optical power meters. An EDFA was used as a booster amplifier with the EML transmitter. By removing the 20-km long fiber and comparing the results with and without fiber, the effect of fiber dispersion was examined. The optical signal was coupled either to a Lucent 1319 receiver for a 64-QAM signal or to a CATV receiver that has a bandwidth of 850 MHz for a 256-QAM signal. The electrical output of the receiver was fed to the Broadcom demodulator with a built-in RF tuner. Total RF power and CNR at the output of the receiver, and the bit error rate at the output of the demodulator are measured as a function of the received optical powers.

Figure 6:
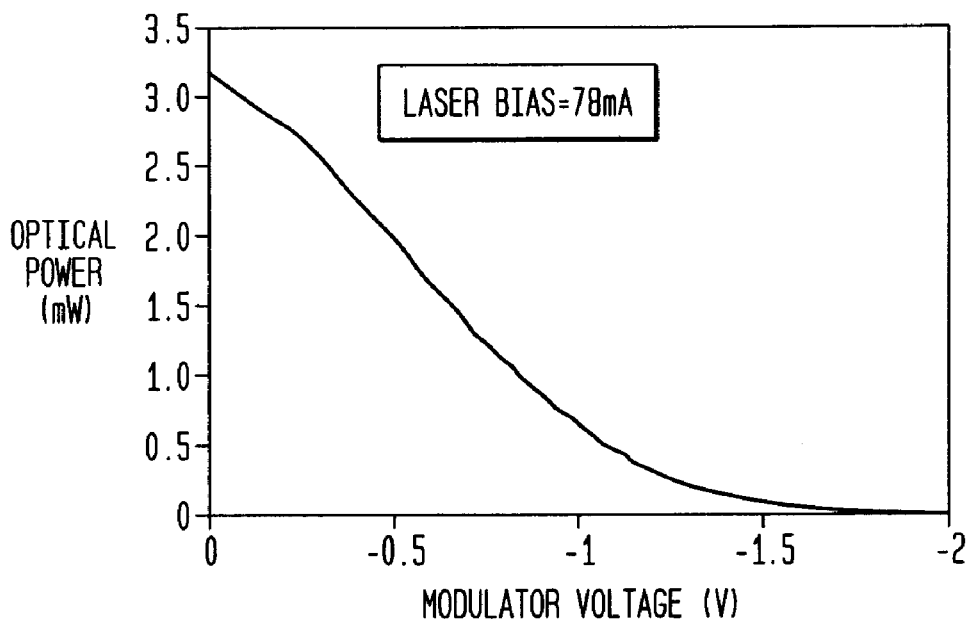
FIG. 6 is a graphical representation of optical power versus modulator voltage of the L-band EML for a laser bias of 78 mA.

By varying the total modulating RF power of QAM carriers, and by varying the laser and modulator bias points, the system is optimized for maximum carrier signal to noise ratio that also results in the lowest bit error rate. Measurements indicated that the optimum operating point of the system corresponds to the maximum modulation index that can be used without causing any in-band distortion. A distortion that overlaps the desired signal is called an in-band distortion. Distortion that lies outside the frequency range of the desired signal is called the out-of-band distortion. The performance of the EML transmitter was very sensitive to the negative bias on the modulator section, as expected. Referring to FIG. 6, there is shown a graphical representation of the optical power at the output of an L-band EML as a function of the modulator voltage. Referring again to FIG. 6, it appears that the modulator should be biased at the point of inflection near –0.5 V, where there is no second order distortion. The modulator transfer function does not exhibit odd symmetry about this point and thus even higher even-order and third order distortion will be non-zero. The best performance is obtained when the EML transmitter is biased between –1.2 V and –1.25 V, where the maximum CNR and minimum bit error rate for all three EML transmitters are measured. The maximum allowable modulating RF power was –2.5 $dB_{me}$ for the externally modulated laser transmitter, and 7 $dB_{me}$ for the EML.

Figure 7:
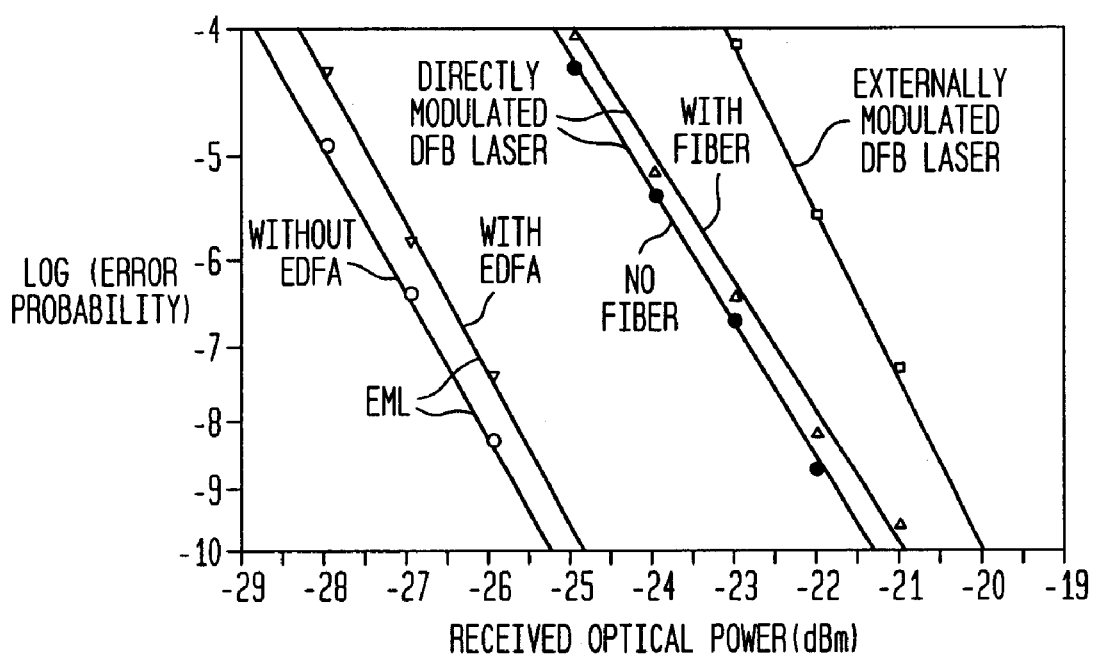
FIG. 7 is a graphical comparison of BERs for 64-QAM signals before FEC for different laser transmitters.
Figure 8:
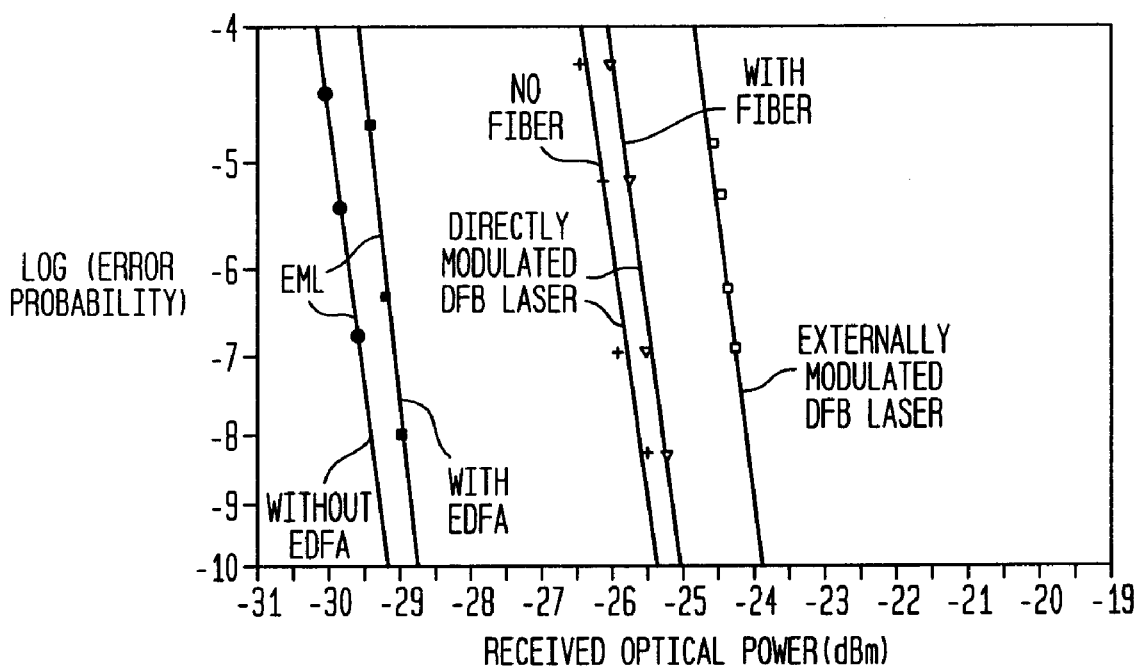
FIG. 8 is a graphical comparison of BERs for 64-QAM signals after FEC for different laser transmitters.

Referring to FIGS. 7 and 8, there is shown a graphical comparison of the measured bit error rate (BER) probabilities for 64-QAM signal before and after FEC, respectively using an EML transmitter, a directly modulated DFB laser transmitter and an externally modulated DFB laser transmitter. Similar results were obtained from other transmitters with some differences that related to the differential quantum efficiency ($\eta$) of their lasers. Transmitters which employ lasers with higher $\eta$ give a higher CNR and a lower BER for a given received optical power because of higher modulation index that increases with increasing $\eta$. There was no detected effect of the 20 km fiber when EML and externally modulated laser transmitters were used. However, with a directly modulated transmitter, there is an optical power penalty of ~0.5 dBo. Use of the EDFA along with the EML transmitter adds a less than 0.5 dBo penalty due to the optical noise of the EDFA.

Figure 9:
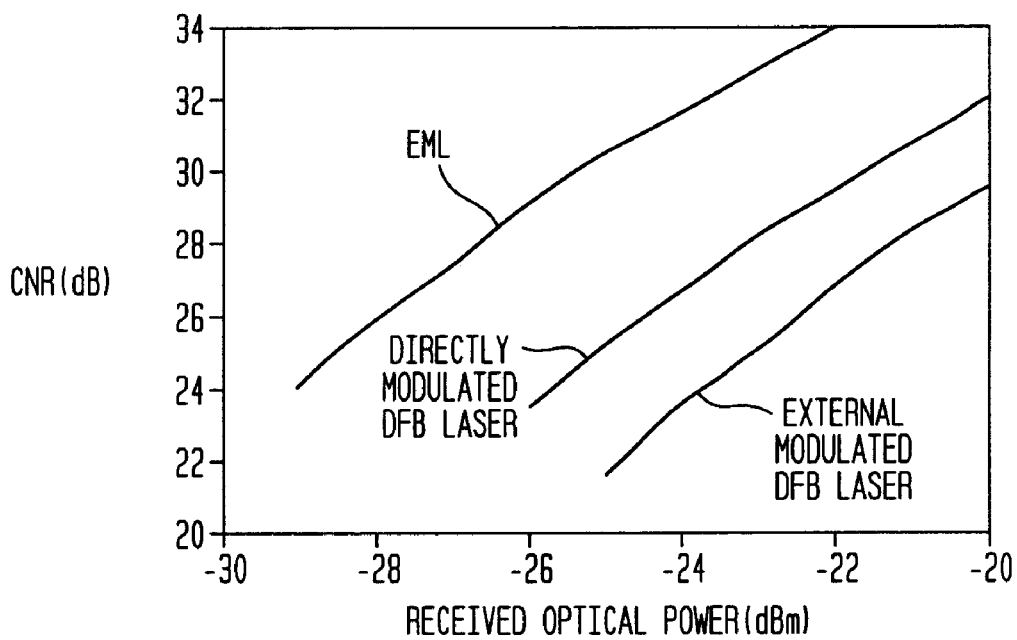
FIG. 9 is a graphical comparison of a 64-QAM test subcarrier signal to noise ratio for different laser transmitters.
Figure 10:
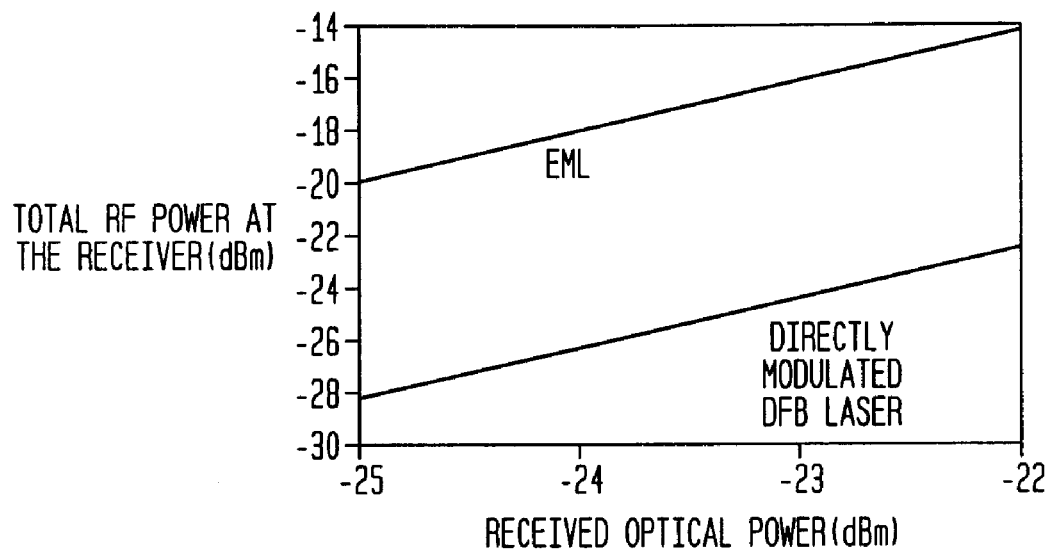
FIG. 10 is a graphical comparison of total RF power of all carriers as a function of the received optical power for EML and directly modulated DFB laser transmitters.

Referring to FIG. 9, there is shown a graphical comparison of the test carrier signal to noise ratio (CNR) at the receiver for all three types of transmitters as a function of the received optical power. The total RF power of all 40 carriers at the output of the receiver as a function of the received optical power for the EML and DFB laser transmitters is compared and represented graphically in FIG. 10.

Figure 11:
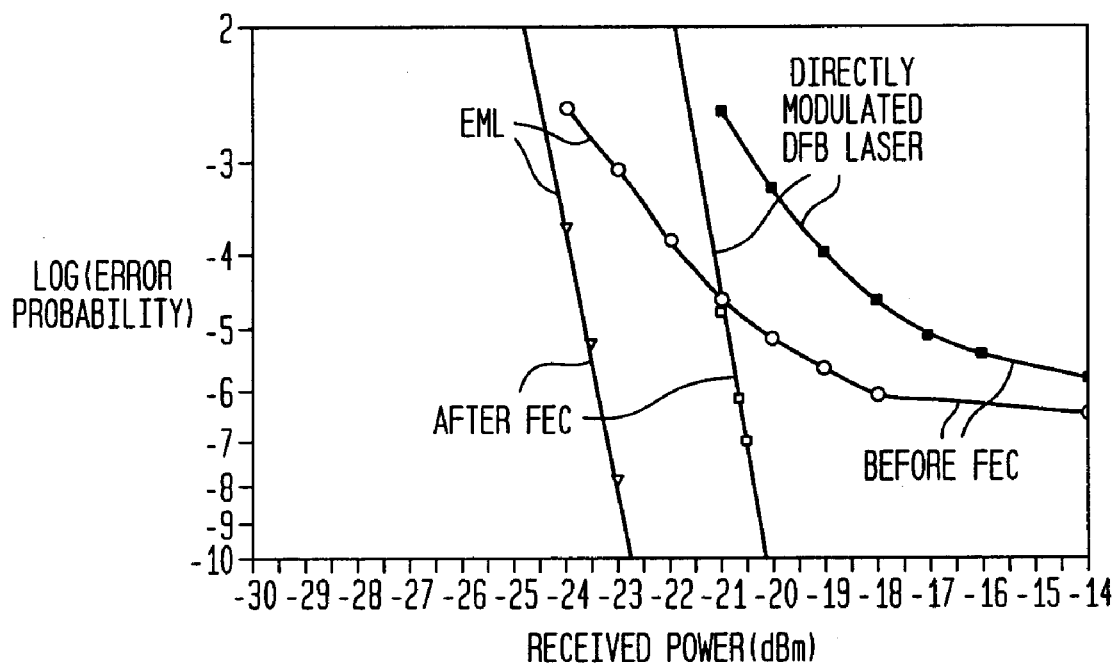
FIG. 11 is a graphical comparison of BERs for a 256-QAM signal using an EML and a directly modulated laser transmitter as a function of the received optical power.

Referring to FIG. 11, there is shown a graphical representation of the BER data for 256-QAM signals for EML and directly modulated DFB laser transmitters before and after FEC. The data in FIG. 11 was obtained using the CATV receiver that had relatively less sensitivity and the RF modulating power was 3 dBe less than that used for 64-QAM experiments. Because of the noise sensitivity of the 256-QAM signals, we could not obtain better than $5 \times 10^{-7}$ BER before FEC with any of the transmitters. However, after FEC there was no error-rate floors and we were able to get error free signal. The receiver performance is about 3 dBo more sensitive with the EML transmitter as compared to the directly modulated laser transmitter. The difference here is 3 dBo instead of 4 dBo measured with 64-QAM signals because of less sensitivity of the CATV receiver and also the reduced modulation index of the EML transmitter due to lower modulating RF power of 256-QAM signal.

The results represented in FIGS. 7 through 11 are indicative of receiver sensitivity 3 to 4 dBo higher with an EML based transmitter as compared to with a directly modulated DFB laser transmitter. When the results are compared with externally modulated DFB laser transmitters, the difference increases by another 1.5 to 2 dBo. Thus, for pure QAM signals, an externally modulated DFB laser transmitter offers no better performance than a directly modulated DFB laser transmitter. Equipment limitations limited measurement of the absolute modulation index but the measurement of relative modulation index, m, suggested that at the lowest BER bias point, m was 2. to 2.5 times higher for the EML transmitter compared to the directly modulated DFB laser transmitter. Using equation 1, this should result in 6 to 8 dBe higher CNR and the total RF power, and the receiver should be 3 to 4 dBo more sensitive. This is in agreement with the results shown in FIGS. 7 through 11. Test results show the 3 to 4 dBo performance advantage of EML transmitters using 64-QAM live video from the headend of BellSouth in Atlanta. With the EML transmitter, most of the live 64-QAM TV channels were able to be received with optical power as low as −28 dBmo.

Due to CSO, frequencies $f_A$ and $f_B$ mix into frequencies at $f_A+f_B$ and $f_A-f_B$. This results in CSO distortion power between 0 Hz to 250 MHz and at 1100 MHz to 1600 MHz due to multiple QAM carriers in 550 to 800 MHz, which falls outside the desired 550 to 800 MHz band. This is an out-of-band distortion. However, due to CTB, frequencies $f_A$ and $f_B$ generate frequencies at $2f_A \pm f_B$ and $2f_B \pm f_A$. $2f_A-f_B$ and $2f_B-f_A$ frequencies will overlap the desired signal frequencies in 550–800 MHz range.

Figure 5A:
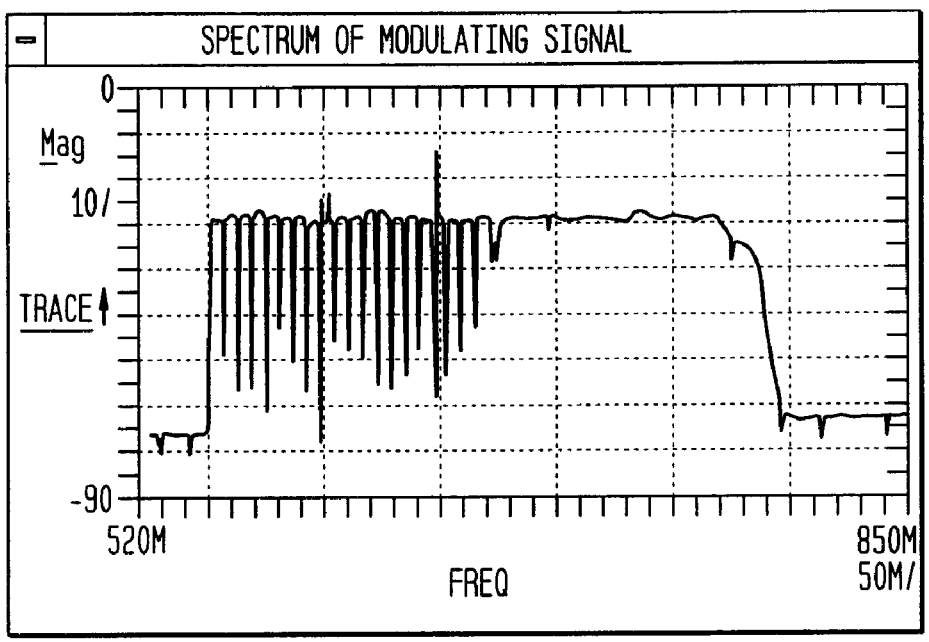
FIG. 5a is a graphical representation of the RF spectra of 64-QAM RF sub-carriers multiplexed modulating signal.
Figure 5B:
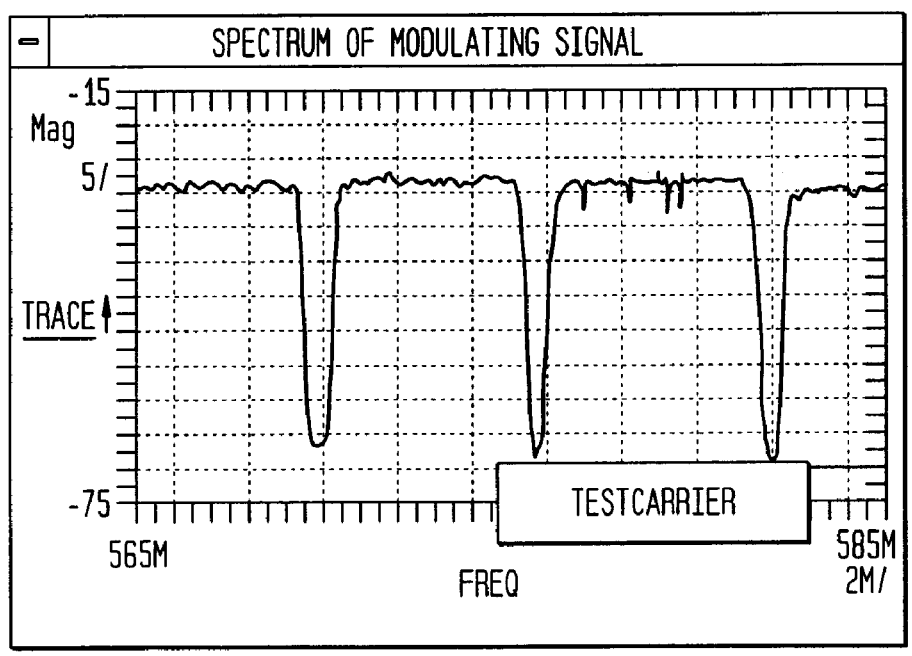
FIG. 5b is a graphical representation of the RF spectra of 64-QAM modulating signal enlarged to show the test carrier at 579 MHz.
Figure 12:
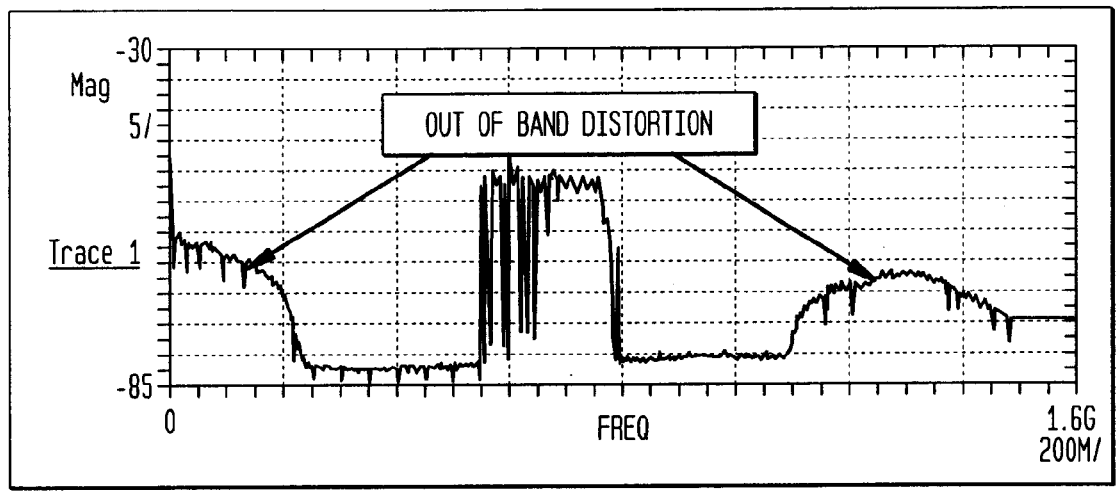
FIG. 12 is a graphical representation of out of band distortion when the modulator of the EML based transmitter is biased at −1.2V to obtain maximum carrier to noise ratio and minimum bit error rate.
Figure 13:
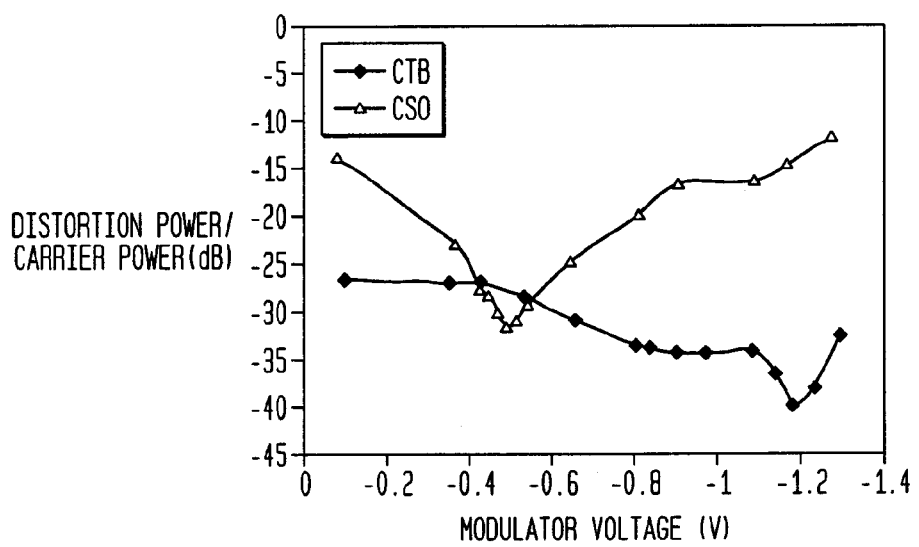
FIG. 13 is a graphical representation of the non-linear distortion powers at 60 MHz corresponding to CSO and at 579 MHz corresponding to CTB relative to the carrier power level as a function of the modulator bias voltage; and, FIG. 14 is a simplified schematic diagram of the circuit for application of the modulator bias.

The QAM modulated carrier shown in FIG. 5a and 5b are similar to white noise with 6 MHz bandwidth per carrier and as a result both the CSO and CTB should be continuous function of frequency for QAM carriers. With EML transmitters at the optimum bias point of −1.2V, out of band distortion at <225 MHz and at>1.1 GHz is observed due to CSO as shown in FIG. 12. With directly and externally modulated DFB laser, no out of band distortion due to CSO was observed. With an EML transmitter, out of band distortion disappeared when the modulator was biased at ∼−0.5V but then the BER increased so much that the EML transmitter had no performance advantage. Because the CTB is an in-band distortion, to measure CTB the test carrier is turned off at 579 MHz, and the level of the noise floor relative to the carrier power level is measured as a function of the modulator bias voltage using an electrical spectrum analyzer. A linear receiver and a linear post amplifier were used. The CSO level at 60 MHz relative to the carrier power level was measured in the same way. The received optical power was kept constant at −15 dBm. At this power level thermal noise and shot noise are negligible. Total modulating RF power was 1.1 dBm. The results, represented by FIG. 13, show the behavior of CSO and CTB as a function of the modulator bias voltage.

Figure 14:
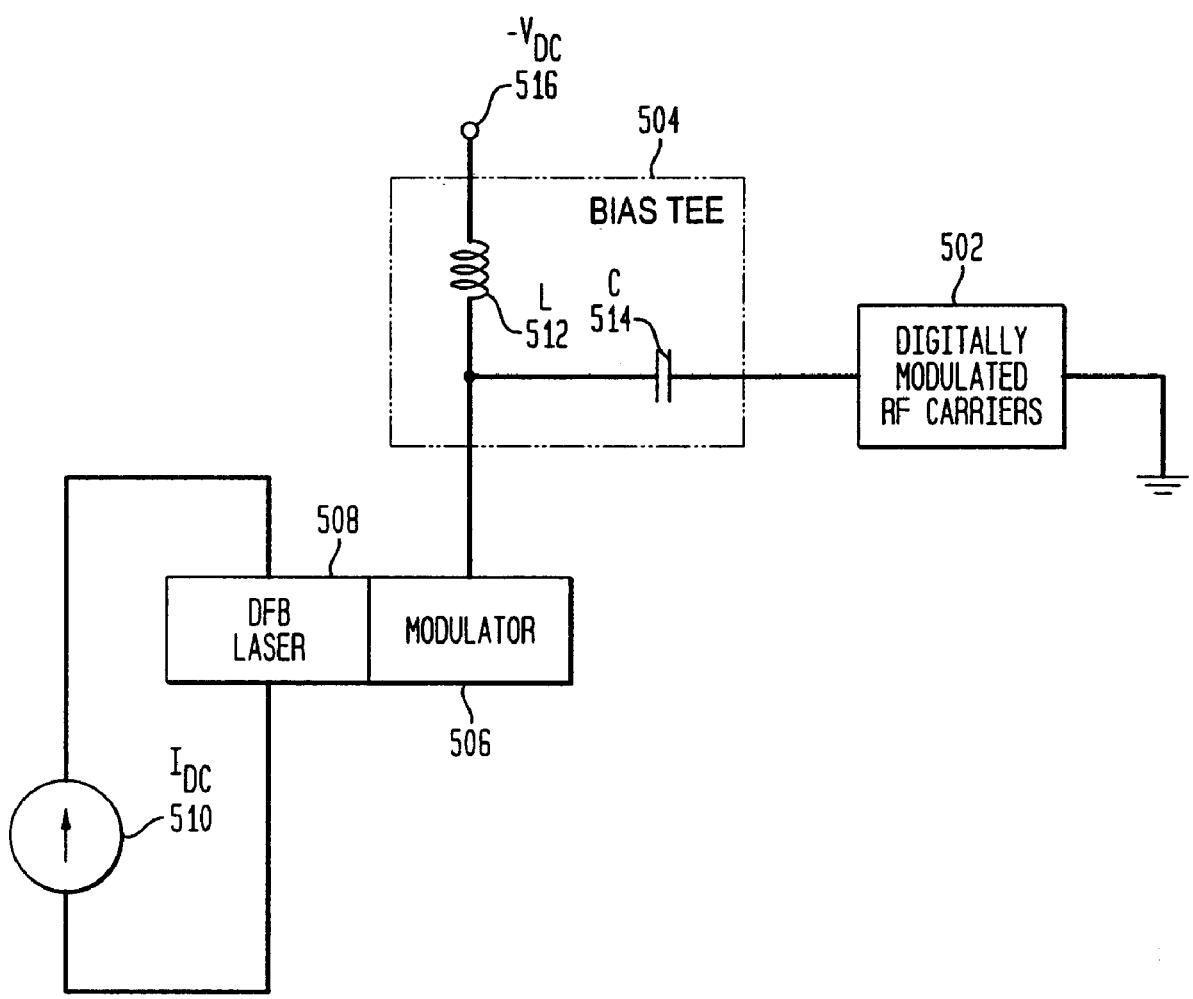

Referring to FIG. 14 there is shown a simplified schematic diagram of the circuit for application of the modulator bias. The digitally modulated RF carriers 502 are coupled through a Bias Tee 504 to the Electroabsorption Modulator 506. The Electroabsorption Modulator 506 is coupled to the DFB Laser 508. A forward bias 510, $I_{DC}$ is applied to the DFB Laser 508. A modulator bias 516, $-V_{DC}$ is applied to the Bias Tee 504. An inductor 512 and a capacitor 514 comprise the Bian Tee 504. The inductor 512 is coupled between the modulator bias 516 and the Electroabsorption Modulator 506. The capacitor 514 is coupled between the digitally modulator RF carriers 502 and the Electroabsorption Modularor 506.

Referring again to FIG. 13, at the point of inflection near −0.5V, the CSO is at its lowest level but the CTB is at a high level. As the negative bias is increased, the CSO increases. The CTB reaches its lowest level at 45 dBe below the signal level at −1.2V, at which point the third order intermodulation distortion is minimum. Because the CTB is an in-band distortion, optimal performance is obtained at this point.

The presence of CSO when the CTB is at the lowest level limits the advantageous use of an EML transmitter to applications where the CSO does not overlap with signal frequencies (i.e. where signal frequencies are in the suboctave range), which is typically the case with QAM carriers due to their higher bandwidth efficiencies.

For optical transmission of QAM signals in the suboctave frequency range using an EML based transmitter, by biasing the modulator at a point where the third order intermodulation distortion is at the lowest level, a higher modulation index is obtained. The higher modulation index increases optical receiver sensitivity by greater than 4 dBo in contrast to a directly or externally modulated DFB laser transmitter without any in-band distortion but at the cost of out of band distortion.

In view of the foregoing description, numerous modifications and alternative embodiments of the invention will be apparent to those skilled in the art. Accordingly, this description is to be construed as illustrative only and is for the purpose of teaching those skilled in the art the best mode of carrying out the invention. Details of the network architecture may be varied substantially without departing from the spirit of the invention, and the exclusive use of all modifications, which come within the scope of the appended claim, is reserved.

What is claimed is:

1. A optical transmitter for digitally modulated radio frequency sub-carriers comprising:

an electroabsorption modulator integrated distributed feedback laser having an electroabsorption modulator section adapted for transmitting the digitally modulated RF sub-carriers in the sub-octave range; and a circuit configured for applying a negative bias to the electroabsorption modulator integrated distributed feedback laser;

wherein the negative bias is selected to increase modulation index of the electroabsorption modulator section of the electroabsorption modulator integrated distributed feedback laser above a modulation index of an electroabsorption modulator section of an electroabsorption modulator integrated distributed feedback laser having a zero bias, without causing in-band nonlinear distortion.

2. The optical transmitter as recited in claim 1 wherein the electroabsorption modulator section of the electroabsorption modulator integrated distributed feedback laser is biased so as to minimize composite triple beat.

3. The optical transmitter as recited in claim 1 wherein the negative bias is approximately between −1.20 volts and −1.25 volts for InGaAsP/InP based material.

4. The optical transmitter as recited in claim 1 wherein the modulation index of the electroabsorption modulator section of the electroabsorption modulator integrated distributed feedback laser is increased while not causing an increase in bit error rate.

5. A system for optical transmission of digitally modulated radio frequency sub-carriers comprising:
   an electroabsorption modulator integrated distributed feedback laser;
   a modulation circuit configured for coupling the digitally modulated radio frequency sub-carriers in the sub-octave frequency range to an electroabsorption modulator section of the electroabsorption modulator integrated distributed feedback laser; and,
   a circuit for applying a negative bias to the electroabsorption modulator section;
   wherein the negative bias is selected to increase modulation index of the electroabsorption modulator section of the electroabsorption modulator integrated distributed feedback laser above a modulation index of an electroabsorption modulator section of an electroabsorption modulator integrated distributed feedback laser having a zero bias, without causing in-band non-linear distortion.

6. The system as recited in claim 5 wherein the electroabsorption modulator section of the electroabsorption modulator integrated distributed feedback laser is biased so as to minimize composite triple beat.

7. The system as recited in claim 5 wherein the negative bias is approximately between −1.20 volts and −1.25 volts for InGaAsP/InP based material.

8. The system as recited in claim 5 wherein the modulation index of the electroabsorption modulator section of the electroabsorption modulator integrated distributed feedback laser is increased while not causing an increase in bit error rate.

9. A method for optical transmission of digitally modulated radio frequency sub-carriers comprising the following steps:
   modulating an electroabsorption modulator section of an electroabsorption modulator integrated distributed feedback laser with the digitally modulated radio frequency sub-carriers in the sub-octave range;
   applying a negative bias to the electroabsorption modulator section;
   wherein the negative bias is selected to increase modulation index of the electroabsorption modulator section of the electroabsorption modulator integrated distributed feedback laser above a modulation index of an electroabsorption modulator section of an electroabsorption modulator integrated distributed feedback laser having a zero bias, without causing in-band non-linear distortion.

10. The method as recited in claim 9 wherein the step of applying a negative bias further comprises applying the negative bias so as to minimize composite triple beat.

11. The method as recited in claim 9 wherein the negative bias is approximately between −1.20 volts and −1.25 volts for InGaAsP/InP based material.

12. The method as recited in claim 9 wherein the modulation index of the electroabsorption modulator section of the electroabsorption modulator integrated distributed feedback laser is increased while not causing an increase in bit error rate.

* * * * *